United States Patent
Lizama et al.

(10) Patent No.: US 9,614,518 B2
(45) Date of Patent: Apr. 4, 2017

(54) CONTROL OF REVERSE-CONDUCTING IGBT

(71) Applicant: ABB Technology Oy, Helsinki (FI)

(72) Inventors: Ignacio Lizama, Dresden (DE); Steffen Bernet, Dresden (DE); Matti Laiteinen, Kirkkonummi (FI)

(73) Assignee: ABB Technology OY (FI)

( * ) Notice: Subject to any disclaimer, the term of this patent is extended or adjusted under 35 U.S.C. 154(b) by 0 days.

(21) Appl. No.: 14/972,420

(22) Filed: Dec. 17, 2015

(65) Prior Publication Data

US 2016/0191042 A1    Jun. 30, 2016

(30) Foreign Application Priority Data

Dec. 29, 2014   (EP) .................................. 14200391

(51) Int. Cl.
*H03K 17/30* (2006.01)
*H03K 17/567* (2006.01)
(Continued)

(52) U.S. Cl.
CPC ....... *H03K 17/284* (2013.01); *H03K 17/0414* (2013.01); *H03K 17/08128* (2013.01);
(Continued)

(58) Field of Classification Search
USPC ......... 327/380–382, 392, 396, 398–399, 401
See application file for complete search history.

(56) References Cited

U.S. PATENT DOCUMENTS

| | | | |
|---|---|---|---|
| 8,729,914 B2 | 5/2014 | Domes | |
| 8,854,109 B2 * | 10/2014 | Eckel | ................. H02M 1/0845 327/380 |

(Continued)

FOREIGN PATENT DOCUMENTS

| | | |
|---|---|---|
| DE | 102009001029 B4 | 12/2010 |
| DE | 102011083841 A1 | 7/2012 |

(Continued)

OTHER PUBLICATIONS

Hermann, et al., Reverse Conducting IGBTs, A new IGBT technology setting new benchmarks in traction converters, IEEE, Sep. 2, 2013, 8 pages.

(Continued)

*Primary Examiner* — An Luu
(74) *Attorney, Agent, or Firm* — Taft Stettinius & Hollister LLP

(57) ABSTRACT

Unique systems, methods, techniques and apparatuses of a reverse-conducting IGBT (RC-IGBT) are disclosed. One exemplary embodiment is a circuit comprising a series connection of controllable switch components where at least one of the controllable switch components is an RC-IGBT. The circuit is operated by applying a pre-trigger pulse to the gate electrode of the RC-IGBT during reverse conduction of the RC-IGBT at a first time instant, the pre-trigger pulse corresponding to a turn-on gate pulse. Next, a turn-on gate pulse is applied at a second time instant to the other controllable switch component of the series connection for controlling the other controllable switch component to a conductive state such that the pre-trigger pulse and the turn-on gate pulse overlap, and ending the pre-trigger pulse after a delay time at the third time instant. The delay time is the time period when the turn-on gate pulse and the pre-trigger pulse overlap.

20 Claims, 9 Drawing Sheets

(51) Int. Cl.
 *H02M 1/084* (2006.01)
 *H03K 17/284* (2006.01)
 *H03K 17/74* (2006.01)
 *H03K 17/0414* (2006.01)
 *H03K 17/0812* (2006.01)
 *H03K 17/28* (2006.01)

(52) U.S. Cl.
 CPC ........... *H03K 17/28* (2013.01); *H03K 17/567* (2013.01); *H03K 17/74* (2013.01)

(56) References Cited

U.S. PATENT DOCUMENTS

| 2012/0025794 | A1 | 2/2012 | Inoue et al. | |
| 2016/0020764 | A1* | 1/2016 | Lokrantz | H03K 17/18 363/131 |

FOREIGN PATENT DOCUMENTS

| EP | 2424112 A9 | 2/2012 |
| WO | 2010149431 A2 | 12/2010 |

OTHER PUBLICATIONS

European Search Report, EP14200391, ABB Technology OY, May 20, 2015.

Drucke, et al., Power diodes with active control of emitter efficiency, Power Semiconductor Devices and ICs, 2001. ISPSD, '01, Proceedings of the 13th International Symposium on . . . , vol., no., pp. 231, 234, 2001.

Alvarez, et al., A new delay time compensation principle for parallel connected IGBTs, Energy Conversion Congress and Exposition (ECCE), 2001 IEEE, vol., no., pp. 3000, 3007, Sep. 17-22, 2011.

* cited by examiner

CONTROL OF REVERSE-CONDUCTING IGBT

FIELD OF THE INVENTION

The invention relates to reverse-conducting insulated bipolar transistors (RC-IGBT), and particularly to control of RC-IGBT.

BACKGROUND OF THE INVENTION

The increasing demand for large power ratings and power density of power converters has been a key motivation for the research and development of new power semiconductors technologies. Power semiconductors have for decades been a topic of intensive research and continual improvement, and are used in applications such as hybrid vehicles, renewable energies, and industrial. Improving semiconductor efficiency and increasing power density are the main development topics. However, as the power density increases, the operating temperature of the device rises and causes thermal cycling issues and shortens the lifetime of the semiconductor.

To mitigate these problems, components called "reverse conducting" IGBTs (RC-IGBTs) have been developed. These semiconductors provide high power density and advantages in thermal cycling. They integrate an IGBT and an anti-parallel diode into a single chip and can operate as an IGBT (forward conduction mode) or as a diode (reverse conduction mode), which enables the discharging of the emitter during device turn-off [1]. As a result, the reverse recovery current peak can be reduced which leads to the reduction of switching losses.

As the RC-IGBT operates as an IGBT, it is known to apply standard switching pulses to the gate of RC-IGBTs, as with PWM or space vector modulation techniques for IGBTs. Further, it is also known to eliminate the modulation signals when the RC-IGBT is in reverse conduction mode [2][3][4]. The state, that is, either forward or reverse conducting of the RC-IGBT can be detected based on measurement of the collector-emitter voltage [3] [4] or measurement of the gate current of the RC-IGBT [2].

For reducing the switching losses it is suggested to apply a desaturation pulse to the gate of the RC-IGBT when the RC-IGBT is in reverse conduction mode [5]. The desaturation pulse in [5] is applied and ended before the gate pulse of a complementary switch component of a half-bridge connection receives its gating pulse. FIG. 1 shows a desaturation pulse presented in [5] in a half-bridge circuit. FIG. 1 shows a situation in which load current is positive and RC-IGBT T1 is in the diode mode. When T1 is in diode mode, the desaturation pulse is applied to the gate of T1 before a turn-on gate $U_{ctrl,T2}$ signal is given to the switch component T2. Although the switching losses are reduced, the losses are not minimized when RC-IGBT is controlled in the above described manner.

BRIEF DESCRIPTION OF THE INVENTION

An object of the present invention is to provide a method and an arrangement for implementing the method so as to overcome the above problem and further reduce the losses of the component. The objects of the invention are achieved by a method and an arrangement which are characterized by what is stated in the independent claims. The preferred embodiments of the invention are disclosed in the dependent claims.

The invention is based on the realization that for minimizing the switching losses of a reverse conducting IGBT the desaturation pulse applied to the gate of an RC-IGBT should overlap the gate pulse of the complementary switch component of an half-bridge connection. This means that in a half-bridge configuration both the upper and the lower switch component receive turn-on gate pulses at the same time for a certain period of time when one of the switch components is turned on and the other is in reverse conduction mode.

The overlapping gate pulses minimize the switching losses as the desaturation or pre-trigger pulse reduces the amount of excess carriers and minimizes the reverse recovery current peak of the RC-IGBT.

According to an embodiment, the delay time, i.e. the duration of the overlap of the gate signals, is determined using a measurement procedure. When the determined delay time is used for the time period of the overlap, the reverse recovery current peak is minimized while operating still safely. The delay time is determined in a simple manner without any additional circuitry.

Further a control logic implementing the overlapping of the turn-on signals is provided. The control logic takes into account the safe operation of the invention such that the overlapping signals are prevented in some cases. The control logic and the related circuitry produce a simple way of obtaining the advantages of the invention. The control logic can be implemented using existing circuitry and logic circuit without any extra components.

BRIEF DESCRIPTION OF THE DRAWINGS

In the following the invention will be described in greater detail by means of preferred embodiments with reference to the attached [accompanying] drawings, in which.

DETAILED DESCRIPTION OF THE INVENTION

Figure 1:
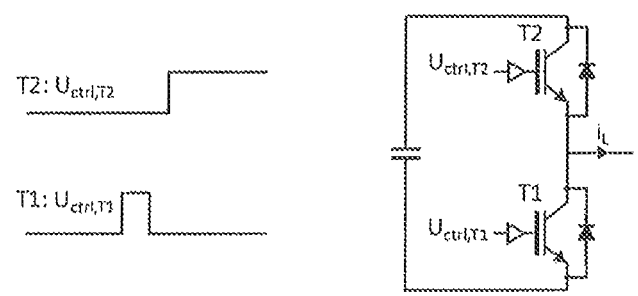
FIG. 1 shows a prior art RC-IGBT desaturation pulse method.
Figure 2:
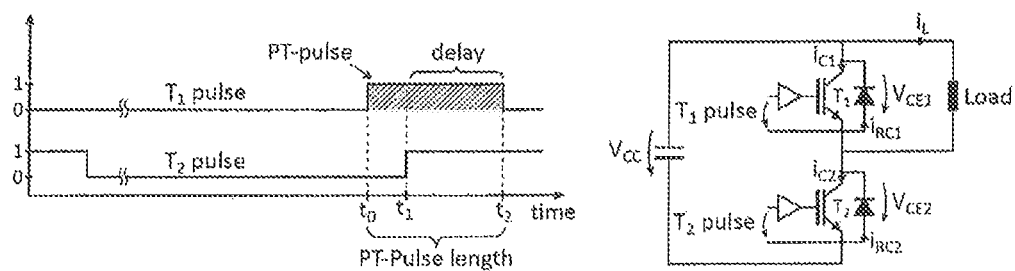
FIGS. 2 and 3 show definition of the pre-trigger pulse of the present invention.

FIG. 2 shows the basic form and timing of the signals produced in the method of the present invention. In the method of the invention, a reverse-conducting IGBT (RC-IGBT) component is controlled when current flows through the component in the reverse conducting direction and when another switch component in series with the RC-IGBT is to be controlled to conducting state.

An RC-IGBT comprises a gate electrode to which control voltages are applied with respect to emitter potential of the RC-IGBT. In the invention, an RC-IGBT is in series connection with another controllable switch component. The other controllable switch component may be another RC-IGBT or another type of controllable component. RC-IGBTs allow the control of excess carrier distribution in reverse conduction mode and thus the switching losses at diode mode turn-off can be adjusted. To control the excess carrier distribution, extra trigger pulses called "Pre-trigger pulses (PT-Pulse)" are applied to the gate unit of the RC-IGBT [1] during a short period of time. In reverse conduction mode, gate pulses do not "turn-on" the device, but rather, the characteristics of the power semiconductor channel can be influenced, thus controlling the excess carrier distribution In the method, a pre-trigger pulse is applied to the gate electrode of the RC-IGBT component when it is in the reverse conduction mode. The pre-trigger pulse is applied at a first time instant $t_0$ and the pre-trigger pulse corresponds to a gate signal normally used for turning the component conductive.

Further in the method, a turn on pulse is applied to the other controllable switch component of the series connection. The turn-on pulse is given to the other controllable switch at a second time instant $t_1$ while the pre-trigger pulse is still active and the pulses are thus overlapping. The pre-trigger pulse is ended at a third time instant $t_2$ such that that the signals are overlapping for a delay time (delay) period.

In FIG. 2 the gating pulses ($T_1$ pulse, $T_2$ pulse) are shown. Gating pulse for the first semiconductor switch $T_1$ is the pre-trigger pulse (PT-pulse) that is initiated at time instant $t_0$. At time instant $t_1$, the other semiconductor switch $T_2$ receives its gating pulse ($T_2$ pulse) for changing the state of the component to conductive. The gating pulses for turning-on or turning-off the components are originated from a modulator or similar device. The pre-trigger pulse is originated from a logic circuit that operates on the basis of the gating pulses from the modulator or similar device.

In FIG. 2 both controllable switch components are RC-IGBTs and the high side RC-IGBT ($T_1$) is in reverse conducting mode (acting as a diode), which means its trigger pulse ($T_1$ pulse) only includes the PT-pulse, and the low side RC-IGBT ($T_2$) is in a forward conduction mode (acting as an IGBT), which means its trigger pulse ($T_2$ pulse) is generated by the modulator (e.g. PWM signal) in the control of the device, such as converter. The PT-pulse is applied before the turn-on signal and transient of the complementary RC-IGBT ($T_2$). Both semiconductors have turn-on commands simultaneously during a short period of time ($t_1$-$t_2$) which is denoted as delay in FIG. 2.

Pre-Trigger Pulse with Overlap

The PT-pulse of the invention can be modified by changing either delay ($t_1$-$t_2$) or length of the PT-pulse ($t_0$-$t_2$ e.g. 2 μs) or both of them. The delay is defined as the period of time where the PT-pulse and the modulation pulse overlap, as presented in FIG. 3. In this case the delay is the period of time $t_1$-$t_2$. The optimal delay is defined as the delay that minimizes the switching losses and it is obtained when the PT-pulse is turned off ($t_2$) at zero crossing current ($I_C$=0 A).

Figure 3:
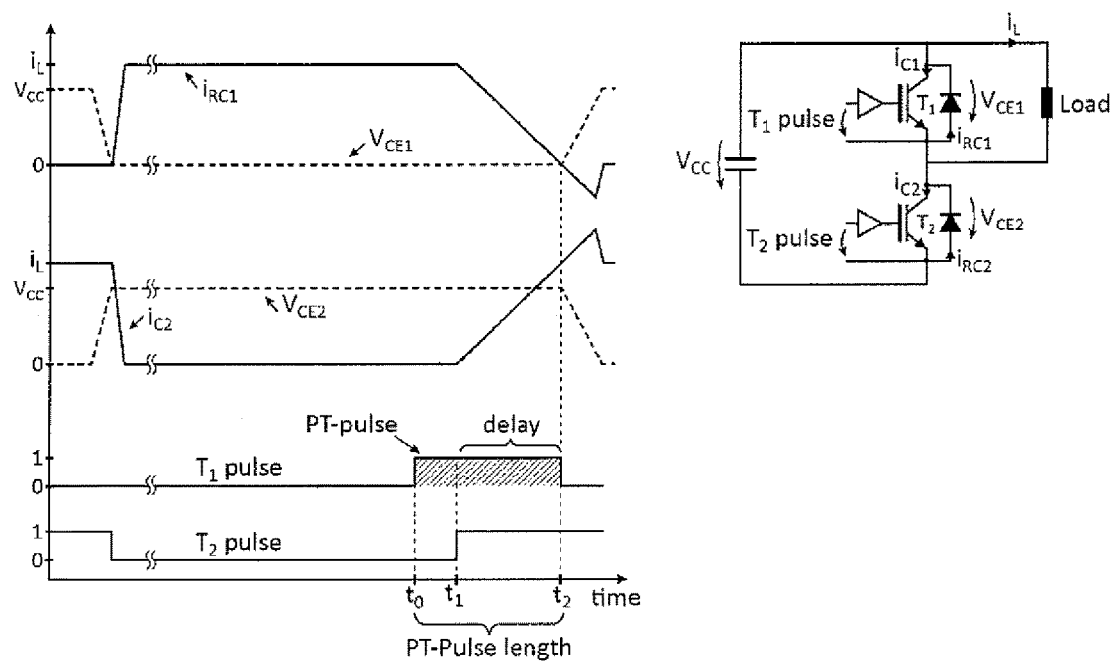

FIG. 3 shows the ideal waveforms of collector currents ($I_C$ and $I_{RC}$), collector-emitter voltages ($V_{CE1}$ and $V_{CE2}$) and PWM trigger pulse pattern. The high side RC-IGBT ($T_1$) of the shown circuit is in reverse conducting mode (acting as a diode) and the low side RC-IGBT ($T_2$) is in a forward conduction mode (acting as an IGBT). To minimize the conduction loss of the high side RC-IGBT ($T_1$) in reverse conduction mode, the gate signal of $T_1$ is off. The PT-pulse is applied to the high side RC-IGBT ($T_1$). As shown, the PT-pulse of "T1 pulse" is activated before the turn-on signal and transient of the complementary RC-IGBT ($T_2$). Both semiconductors have turn-on commands simultaneously during a short period of time ($t_1$-$t_2$). Thus the excess carrier amount and the reverse recovery current peak of the RC-IGBT ($T_1$) are reduced, leading to the reduction of switching losses.

Circuit Structure

Figure 4:
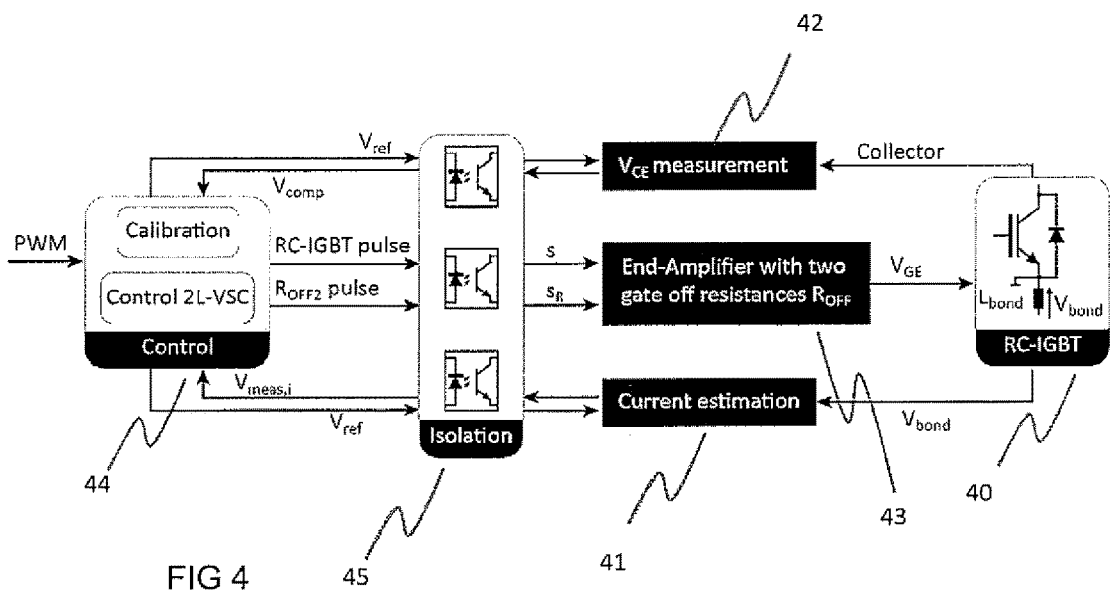
FIG. 4 shows an example of block structure for producing proper pulse for RC-IGBT.

A block diagram circuit realizing an embodiment of the method of the invention is described in the following with reference to FIG. 4. Each entity of the circuit is described in more detail in separate subparagraphs. The circuit of FIG. 4 is used for controlling a single RC-IGBT 40.

The "Current estimation" 41 block estimates the collector current by measuring the voltage $V_{bond}$ across the stray inductance $L_{bond}$ of the RC-IGBT.

The "VCE measurement" block 42 is used to detect whether the RC-IGBT is in forward or reverse conduction mode.

The "End-Amplifier with two gate off resistances" block 43 is used to trigger the RC-IGBT with appropriate gate off resistances $R_{off}$.

In the "Control" block 44 an algorithm is implemented in a digital platform (e.g. FPGA), which is used to calibrate and generate proper trigger pulse for a two-level voltage source converter (2L-VSC) with RC-IGBT.

The exact implementation of the described functional blocks can be varied, for example a digital platform (e.g. FPGA) can be included in the gate unit, and thus the isolation stage 45 can be eliminated. The use of explained circuit principle is not limited to 2L-VSC but can be used with other topologies as well including multilevel (A)NPC-topologies.

The purpose of FIG. 4 is to provide an overview of an arrangement which can be used to implement one or more embodiments of the invention. The various signals and function of the entities in FIG. 4 are described below.

Functions of the Circuit

End-Amplifier with Two Gate Off Resistances $R_{OFF}$

Figure 5:
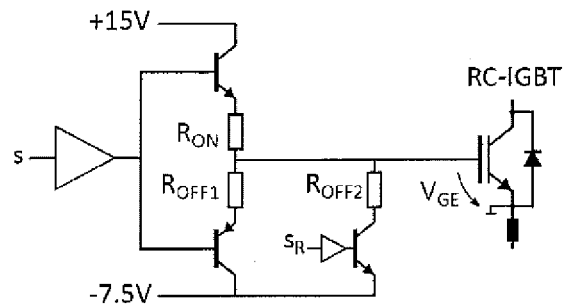
FIG. 5 shows an example of an end-amplifier circuit.

The RC-IGBT is triggered using an AB-amplifier circuit with two different gate off resistances $R_{OFF1}$ and $R_{OFF2}$, as shown in FIG. 5. When the RC-IGBT is in forward conduction mode, a standard IGBT gate turn-off resistance $R_{OFF1}$ is selected, triggered by the signal pulse "s". When the RC-IGBT component it is in reverse conduction mode, a reduced gate turn-off resistance $R_{OFF2}$ (e.g $R_{OFF2} \ll R_{OFF1}$) is selected, triggered by the signal pulse "$s_R$". As a result the switching losses can be reduced. FIG. 5 shows signal pulse "s" that controls the amplifier circuit. For turn-on, signal pulse in high level causes the upper switch of the amplifier circuit to conductive state and a voltage of +15 is applied through $R_{ON}$ resistor to the gate of the component. The emitter of the component is in ground potential and the positive gate to emitter voltage turns the component on.

When turning the component to blocking state or off-state from the conductive state, a negative gate voltage with respect to emitter is provided through resistors $R_{OFF1}$. When the RC-IGBT is in reverse conduction mode and pre-trigger pulse is given, the pre-trigger pulse is ended using a separate switch component which connects the gate of the RC-IGBT to negative auxiliary voltage (−7.5) through a second turn-off resistor $R_{OFF2}$ triggered by "$s_R$". The resistance of the second turn-off resistance can be selected to be considerably smaller than that of the gate resistor for turn-off ($R_{OFF1}$) as the RC-IGBT is not in forward-conduction mode when it is applied. The smaller resistance sets the RC-IGBT to blocking state more quickly than a higher resistance.

The circuit of FIG. 5 is a possible implementation of a certain feature relating to the invention. As shown also in FIG. 4, the circuit of FIG. 5, receives pulses "RC-IGBT pulse" and "$R_{OFF2}$ pulse" from the control block and amplifies the pulses such that RC-IGBT is controlled on the basis of the pulses. The mentioned pulses outputted by the control block 44 are fed to isolation block 45 and further renamed as signals "s" and "$s_R$" without modification of the shape of the pulses. Further, the circuit presented in FIG. 5 is independent of the method of the invention as such, as the circuit produces functionality employed in the method and in its embodiments.

Figure 6:
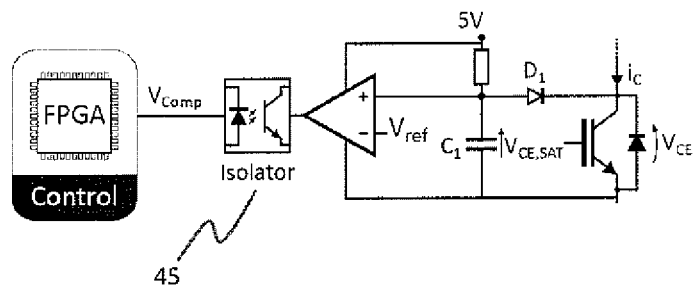
FIG. 6 shows an example of a circuit for determining the operation mode of an RC-IGBT.

$V_{CE}$ Measurement $V_{CE}$ is used to determine when the RC-IGBT is in reverse conduction mode ($I_C<0$) which can be determined by the sensed collector emitter voltage $V_{CE}$. A possible implementation of this is shown in FIG. 6. The collector emitter voltage $V_{CE}$ is sensed via the diode $D_1$ and this voltage, $V_{CE,SAT}$, is compared with a small reference voltage $V_{ref}$ (e.g. Vref ∼0 V). The output signal $V_{comp}$ from the comparator is communicated to the control block, e.g. FPGA, (with a galvanic isolation mechanism) as the binary signal $V_{comp}$ which indicates the operating mode of the RC-IGBT. The signal $V_{comp}$ is equal to 0 when the RC-IGBT is in reverse conduction mode and 1 when it is in forward conduction mode.

In the example of FIG. 6 a diode $D_1$ is connected to the collector terminal of the RC-IGBT such that the cathode of the diode is connected to the collector terminal. The anode of the diode $D_1$ is connected to a terminal of a capacitor $C_1$, the other terminal of which is connected to the emitter of the RC-IGBT. The anode of the diode is further connected through a resistor to positive voltage level (e.g. 5V). The small reference voltage $V_{ref}$ is connected to negative input of an operational amplifier and the anode of the diode is connected to the positive input of the operational amplifier. When the RC-IGBT is in conduction state (forward or reverse direction), current flows through the diode $D_1$ and the voltage across the capacitor $C_1$ $V_{CE,SAT}=V_{CE}-V_{D1}$. When the RC-IGBT conducts in forward direction $V_{CE,SAT}$ is positive, e.g. $V_{CE,SAT} \approx 4-1 \approx 3V$. This positive input to the operational amplifier exceeds the small reference voltage $V_{ref}$, therefore the output of the comparator is 1. When the RC-IGBT is in reverse conduction mode $V_{CE,SAT}$ is negative, e.g. $V_{CE,SAT} \approx -2-1 \approx -V$ which is lower than $V_{ref}$, and thereby the output of the comparator is 0. In FIG. 6 also the isolation stage 45 is shown through which the logical state information $V_{comp}$ is led to the control block 44.

To secure intended output voltage and to minimize the possibility of instantaneous DC-short circuit due to the wrong polarity estimation of the current, a dead-band is preferably defined when the load current is small or changes its polarity. When current is in the dead-band, the PT-pulses are disabled or, as alternative, their delay is set to 0μs. During this region, normal modulation pulses will be applied to both RC-IGBTs. The extent of the dead-band is defined per $$\text{dead-band} = \frac{di}{dt} \cdot PTL$$

where PTL is the PT-pulse duration. A typical di/dt of the load current for IGBTs of 200 A is in the range of 0.23 A/μs. Therefore the minimum dead-band where the PT-pulse should be disabled or its delay set to 0ps is:

$$\text{dead-band} = 0.23 \frac{A}{\mu s} \cdot 1.5 \ \mu s = \pm 0.345 \ A = \pm I_{Lim}$$

When the duration of the PT-pulse is selected to be 1.5 μs. The dead-band range can be easily adjusted by modifying the small reference voltage ($V_{ref}$) in the collector emitter measurement scheme (FIG. 6).

Figure 7:
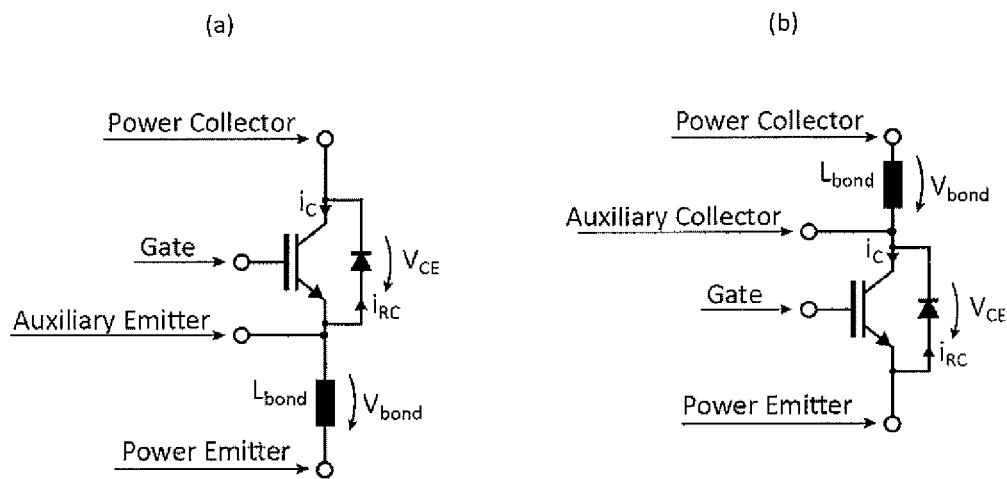
FIGS. 7 (a) and (b) show simplified models of RC-IGBT.

Current Estimation Stage:

In the present disclosure, the current is preferably estimated by measuring the voltage ($V_{bond}$) across the stray inductance ($L_{bond}$) which can be located between the power emitter and auxiliary emitter or between the power collector and auxiliary collector, as shown in FIGS. 7 a and b. The bond voltage $V_{bond}$ is proportional to the collector current slope according to (1). By applying the sign function, it is possible to obtain information about whether the collector current is increasing (turn-on transient) or decreasing (turn-off transient).

$$L_{bond} \frac{di}{dt} = V_{bond} \quad (1)$$

$$\text{sign}\left[\frac{V_{bond}}{L_{bond}}\right] = \text{sign}\left[\frac{di}{dt}\right] \quad (2)$$

Figure 8:
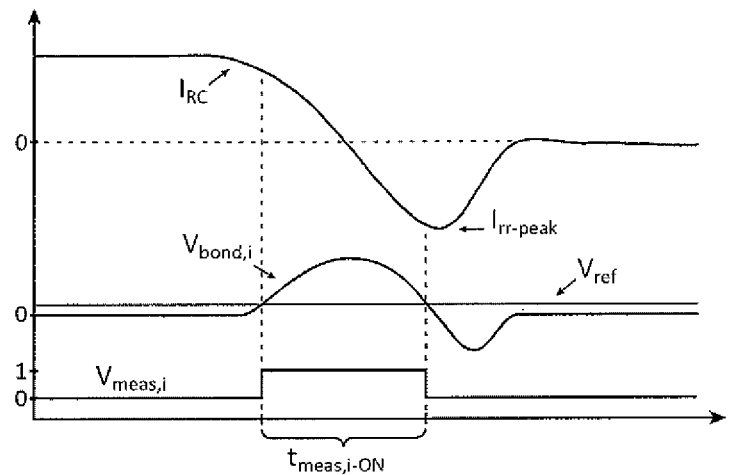
FIG. 8 shows voltage and current waveforms in connection with current estimation.

The principle of the collector current estimation is shown in FIG. 8. The bond voltage $V_{bond}$ is sensed and compared with a low threshold value ($V_{ref}$) in order to approach the sign function. A binary signal is generated ($V_{meas,i}$), where the pulse length represents the period in which the reference voltage $V_{ref}$ is exceeded [6, 7]. The length of this period, defined as $t_{meas,i-ON}$, is related to the sum of the collector current and the reverse recovery current ($I_C+I_{rr}$). Thus, for a given collector current, $t_{meas,i-ON}$ is related to reverse recovery current $I_{rr}$.

Figure 9:
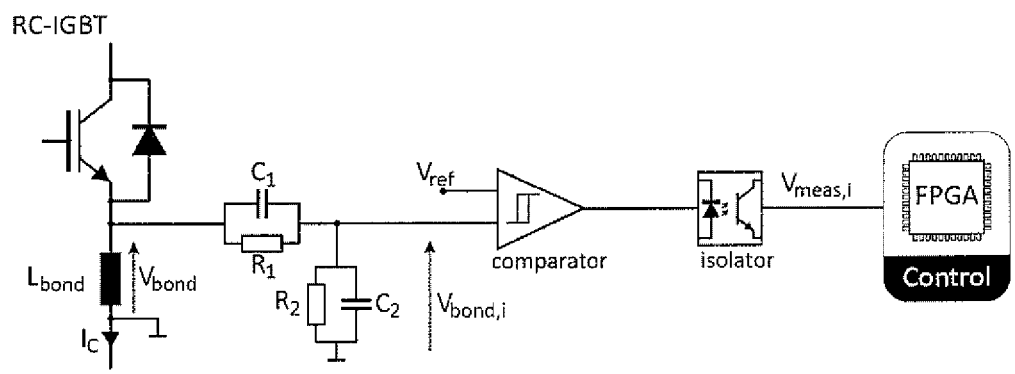
FIG. 9 shows an example of an circuit for estimating current.

FIG. 9 shows a block diagram of one feasible implementation of the current estimation method, where the bond voltage $V_{bond}$ is measured by a compensated voltage divider consisting of resistances $R_1$, $R_2$ and capacitances $C_1$, $C_2$ for obtaining compensated voltage $V_{bond,i}$. The compensated voltage is compared with a small reference value $V_{ref}$. The comparator output signal is galvanically isolated and sent to the control stage (e.g. FPGA) as $V_{meas,i}$. An algorithm extracts the time information and estimates the reverse recovery current $I_{rr}$ for a given collector current.

Even though a method based on measuring the bond voltage is explained here in detail, it should be noted that the reverse recovery peak value information is possible to be obtained also by other means, which include direct or indirect current measurement methods. Direct methods would be using current measurement like current transformers, current transducers, shunt resistor, etc. A Rogowski coil could be used directly to extract the time of the current rise similarly to the bond voltage measurement or with an integrator circuit to detect the peak value of the current.

Some RC-IGBT chips may also have an integrated current measurement output, which can be used either for current rise time or peak value extraction.

Control Stage

The control algorithm is implemented preferably in a digital platform e.g. FPGA. The control algorithm comprises a calibration algorithm and a specific control scheme. The calibration algorithm is used to automatically find the optimal delay used in the method of the invention. It can be implemented in a start-up routine. The control scheme presented as an example generates and applies proper trigger pulses for a 2L-VSC with sinusoidal current. These separate entities are described below in detail.

Calibration Algorithm

An important parameter of the pre-trigger pulse is the "delay", as an incorrect "delay" time could increase the switching losses of the RC-IGBT and it could also produce short-circuit situations. The optimal delay depends on various parameters like collector current, collector emitter voltage, junction temperature and the RC-IGBT type. The definition of the delay time is presented in connection with FIGS. 2 and 3.

The optimal delay can be obtained automatically by estimating the collector current of a RC-IGBT and decreasing its reverse recovery current peak for a given collector current. The current is estimated by using the "current estimation" scheme presented in connection with FIGS. 7, 8 and 9. The algorithm can be implemented in a start-up routine in a digital platform, e.g. FPGA. A possible software implementation of the start-up routine is depicted in the flowchart of FIG. 10.

Figure 10:
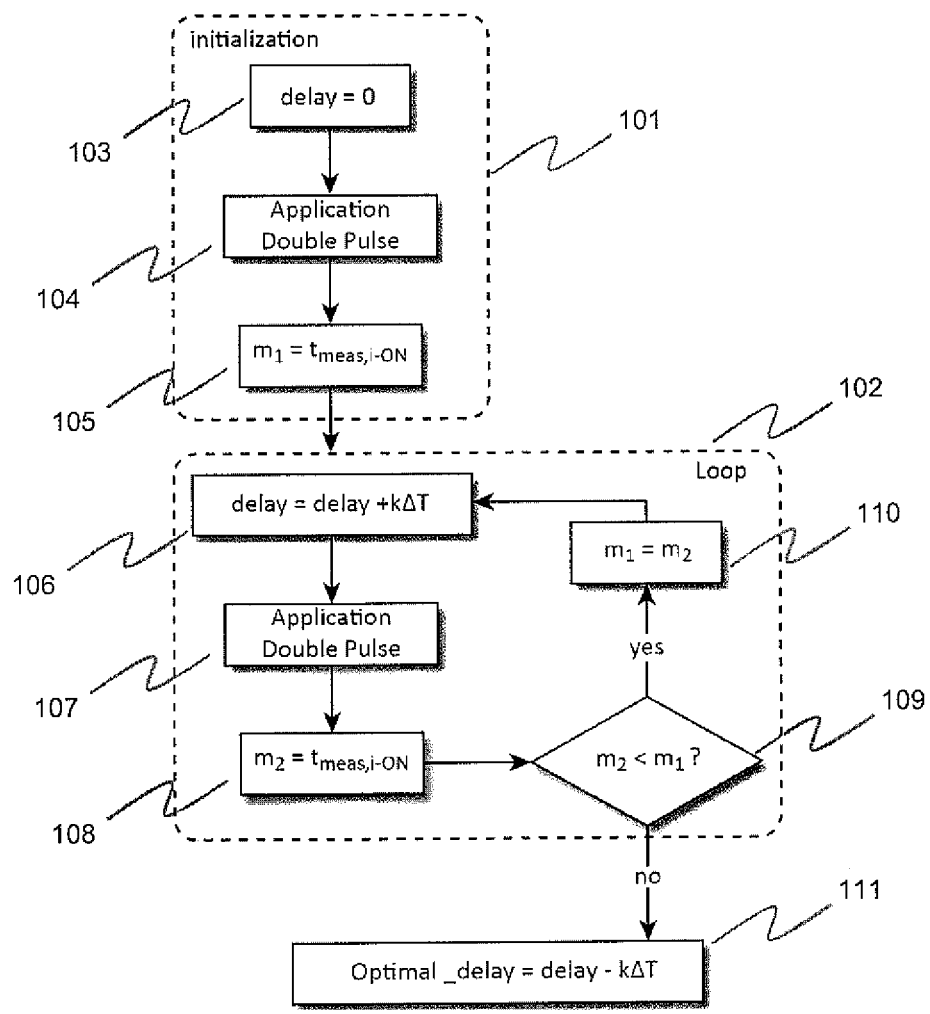
FIG. 10 shows a flowchart for an implementation for determining the optimal delay automatically.

The flowchart of FIG. 10 is divided into two sections which are the initialization 101 and the loop 102. In Initialization, the aim is to estimate the collector current using the current estimation scheme presented in FIG. 8 with the delay set to zero. More specifically, in the method the delay is set to zero 103, and the pulse test with the PT-pulse presented in FIG. 2 is conducted 104 with delay=0. When delay=0 the PT-pulse finishes when the gate pulse of the complementary RC-IGBT turns on. As overlap does not exist, any short circuit situation is avoided.

During the pulse test, $t_{meas,i-ON}$ is determined 105 as presented in FIG. 8, using, for example, the circuit of FIG. 9 for estimating the collector current during the turn-off transient of the RC-IGBT. The determined time $t_{meas,i-ON}$ which corresponds to reverse recovery current is assigned 105 to variable $m_1$. Variable $m_1$ is fed to the loop 102 as the starting value of the time that corresponds to the reverse recovery current.

In the loop 102 of flowchart of FIG. 10 the delay is first increased 106 from initial value of zero by adding value $k \cdot \Delta T$ to the previous value of delay, i.e. delay=delay+$k \cdot \Delta T$. The $\Delta T$ is fixed to a certain increment of time, for example to 40 ns. k is a gain factor and may have a value of 1, for example.

The pulse test is applied 107 with a new delay and $t_{meas,i-ON}$ is determined 108 as in the initialization. The determined time is assigned to variable $m_2$.

The variables $m_1$ and $m_2$, i.e. the time periods obtained with the previous two pulse tests, are compared 109. If $m_2$ is smaller than or equal to $m_1$, then the value of $m_2$ is assigned 110 to $m_1$, and the process returns to 106, in which the delay is further increased. In other words, if the determined time period is reduced from the previous determination of time, then the delay is further increased. When the delay nears an optimum value, the reverse recovery current and thus the determined time $t_{meas,i-ON}$ is reduced.

If the result from the comparison 109 is that $m_2$ is greater than $m_1$, then the last increment made to delay resulted in increase of the reverse recovery current. Therefore the optimal delay was used in the previous round and its value can be outputted from the process 111 as Optimal_delay=delay−$k \cdot \Delta T$.

Figure 11:
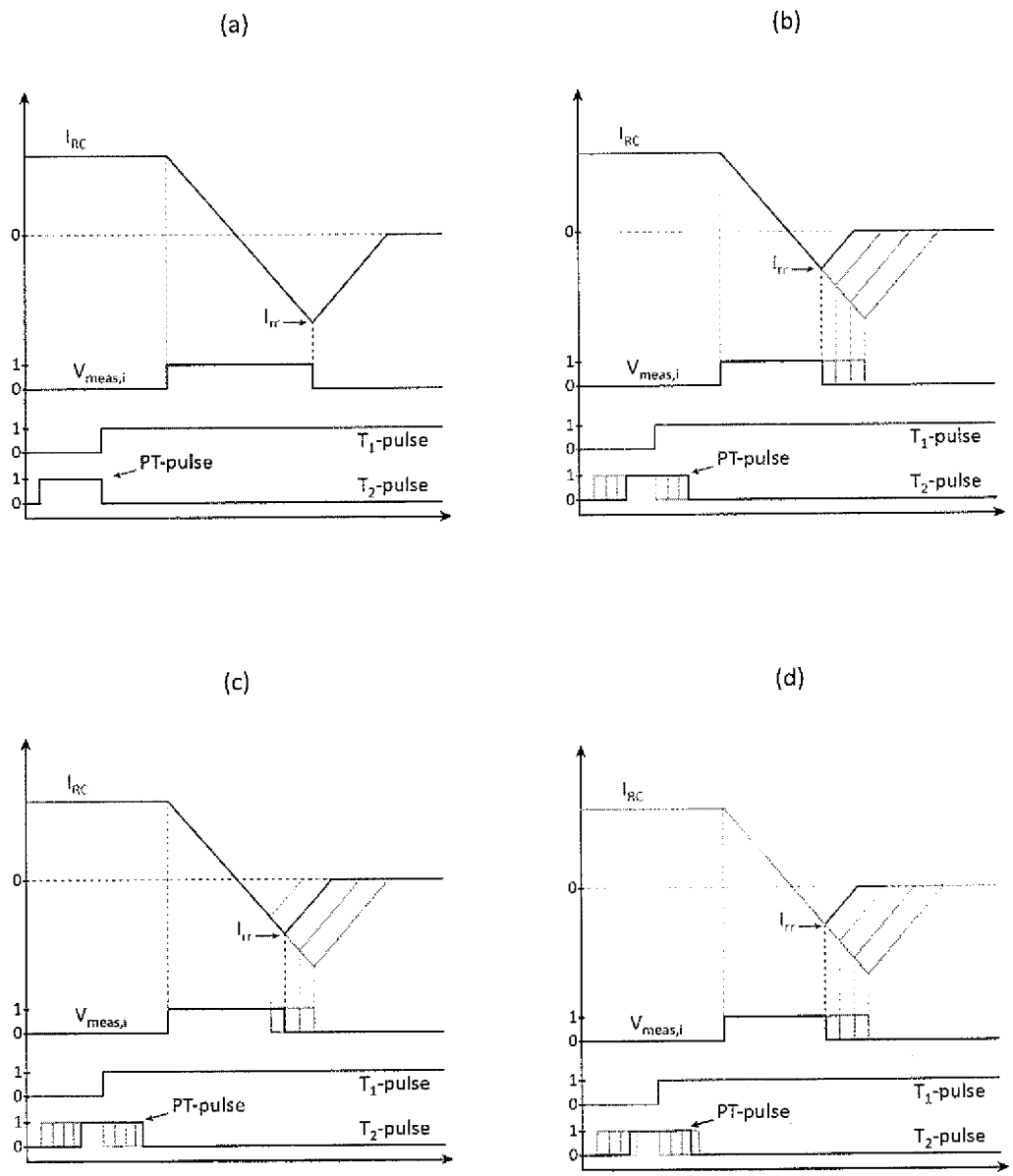
FIG. 11 shows current and voltage waveforms during the operation of the flowchart of FIG. 10.

The start-up routine algorithm presented above measures and iteratively reduces the duration of the signal $V_{meas,i}$, and consequently, the reverse recovery current $I_{rr}$ for a given collector current (e.g. at nominal collector current). An example of the start-up routine operation is shown in FIG. 11. In the initial condition (FIG. 11 (a)), the delay of PT-pulse included in "T2-pulse" is 0ps, which means the digital signal of the PT-pulse finishes when the digital gate pulse "T1-pulse" is turned on. During the following steps, the delay is increased while $t_{meas,i-ON}$ and consequently, $I_{rr}$ are decreased. In the fourth step (FIG. 11 (b)) the algorithm finds the optimal delay. However, it applies one more step (FIG. 11 (c)) and $I_{rr}$ increases again. Eventually, the algorithm detects a rise of $I_{rr}$ and decreases the delay in one step, as shown in FIG. 11 (d).

Control 2L-VSC Algorithm:

Once the optimal delay of the PT-pulse is automatically found by the start-up routine, a new algorithm generates, controls and applies the proper pulses for the operation of a 2L-VSC with RC-IGBT. The optimal delay remains preferably constant during the whole current range operation of the RC-IGBT. The control scheme: applies the PT-pulse only when the RC-IGBT is in a reverse conducting mode, selects different gate off resistances depending on the state of the RC-IGBT (forward or reverse conduction mode), and disables the modulation signal (e.g. PWM) when the RC-IGBT is in reverse conduction mode, in order to reduce the VEC on-state voltage, and consequently, its on-state losses.

Figure 12:
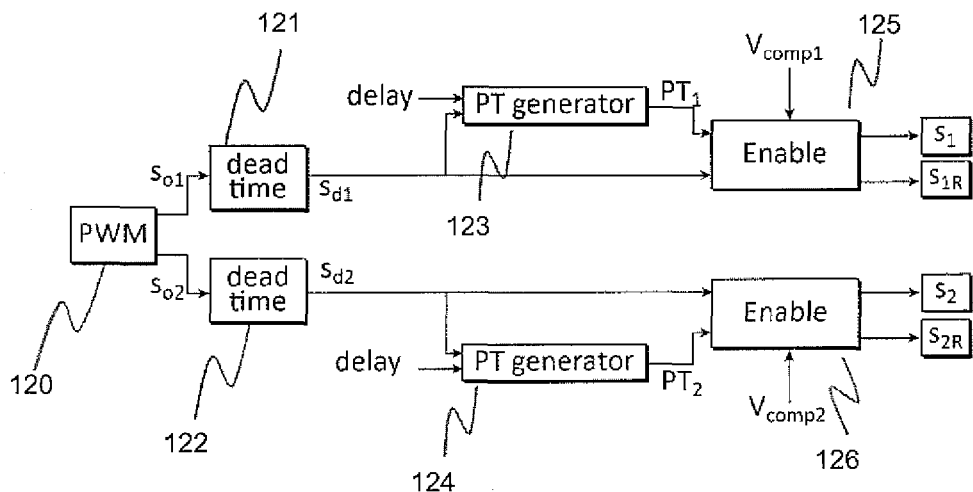
FIG. 12 shows an example of a structure for controlling an RC-IGBT.
Figure 13:
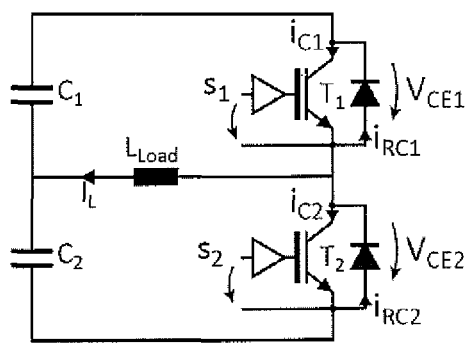
FIG. 13 shows a half-bridge configuration having RC-IGBT components.

FIG. 12 shows an example of a block diagram for implementing the scheme for controlling a two-level voltage source converter (2L-VSC) shown in FIG. 13. The signals $s_{o1}$ and $s_{o2}$ are standard modulation signals, like pulse width modulation (PWM, 120), Space vector, etc. The modulation signals are thus originating from a controller of the device. The signals $s_{d1}$ and $s_{d2}$ correspond to the modulation signals with a dead time. Dead time is inserted to the modulation signals with blocks 121, 122 by delaying the turn-on of the signals such that actual component turns off prior to the turn-on of the complementary component so that the components in series are not conducting at the same time.

The "PT generator" block 123, 124 generates the PT-pulses $PT_1$ and $PT_2$ after every high to low transition of $s_{d1}$ and $s_{d2}$. In generating the PT-pulses, the delay is taken into account such that the signal is generated at a certain time instant.

The "Enable" block 125, 126 selects the application of the PT-pulse or the modulation signal (e.g. PWM). After a low to high transition of the PT-pulses $PT_1$ and $PT_2$, the state of the RC-IGBT is acquired by the signals $V_{comp1}$ and $V_{comp2}$. If the RC-IGBT is in reverse conduction mode, the output signal ($s_1$, $s_2$) includes only the PT-pulse and it is also turned off with a reduced gate off resistances $R_{OFF2}$, triggered by the signal $s_{1R}$ or $s_{2R}$. If it is in forward conduction mode, the output signal $s_1$ or $s_2$ only includes the modulation signals and it is turned off with a standard gate off resistances $R_{OFF1}$. The various signals with their timings are described in more detail with reference to FIG. 15.

Figure 14:
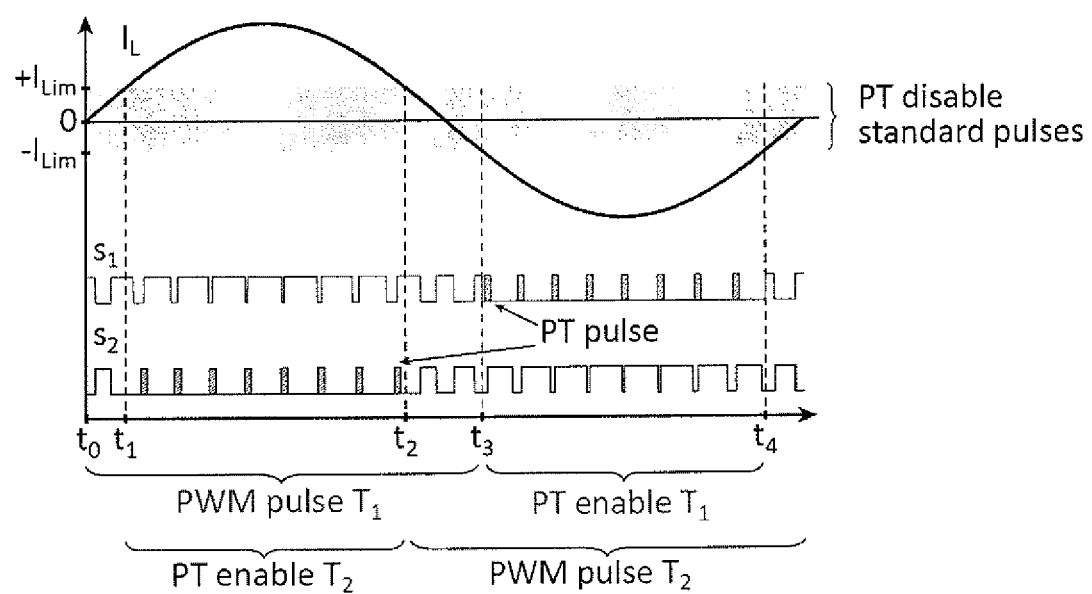
FIG. 14 shows current and voltage waveforms when the method is used in a half-bridge configuration.

Ideal waveforms of a sinusoidal current and proper trigger pulses for RC-IGBT are presented in FIG. 14. The PT-pulses are disabled if $|I_L|<|I_{L,lim}|$, defined by the dead-band region. In this region the normal modulation pulses will be applied to both RC-IGBTs ($t_2$-$t_3$).

Figure 15:
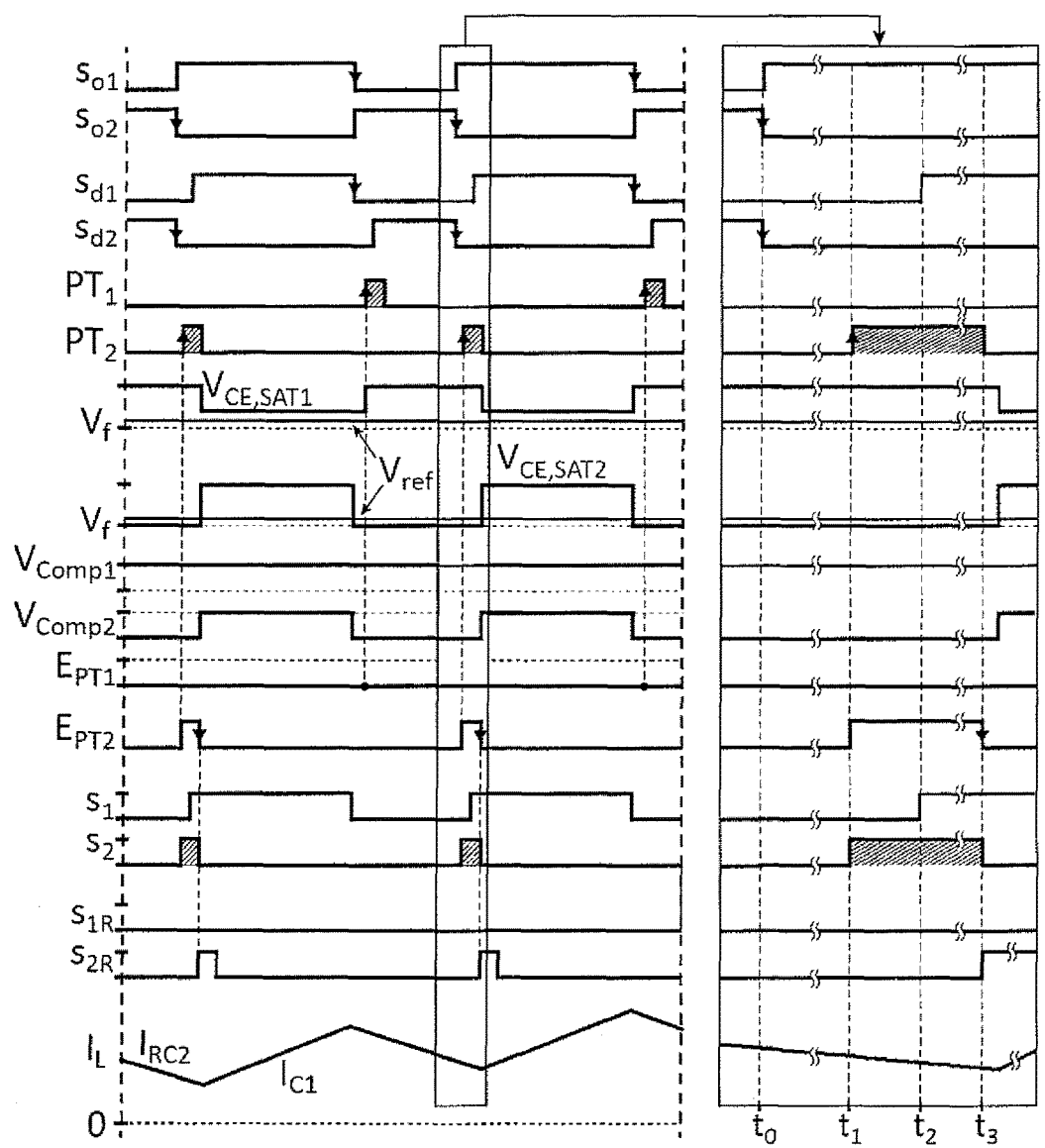
FIG. 15 shows various signals generated during the operation of the method.

The signals generated by the proper pulse generation scheme are presented in FIG. 15 for a 2L-VSC topology shown in FIG. 13. In this case the load current $i_L$ is positive and out of the dead-band region. The RC-IGBT $T_1$ is in forward conduction mode ($V_{comp1}$=1) and the RC-IGBT $T_2$ is in reverse conduction mode ($V_{comp2}$=0). The PT-pulses are enabled by the signals $E_{PT1}$ and $E_{PT2}$. The trigger pulses $s_1$ and $s_2$ are sent to the gate unit, where $s_2$ includes the PT-pulse signal. After a high to low transition of the applied PT-pulse, a reduced gate off resistor is triggered by the signal $s_{2R}$.

The signals presented in FIG. 15 are described in detail for better understanding of the invention and its embodiments. Reference is made particularly to the partial enlargement in the right side of FIG. 15. At time instant $t_0$, the modulator of a device produces modulation signals $s_{o1}$, $s_{o2}$ for changing the state of the switch components. In the known manner per se, a dead-time is inserted to the rising edge of the modulation signal and the signals with dead-time are presented in FIG. 15 as $s_{d1}$, $s_{d2}$. The length or duration of the dead-time is from time instant $t_0$ to time instant $t_2$.

In the embodiment, after each transition from high to low of modulation signals with dead-time, a pre-trigger pulse is generated. A pre-trigger pulse $PT_2$ is shown to be going high at time instant $t_1$. In the larger time scale other state changes of PT-pulses are also shown.

The PT-pulses are applied to the gate of RC-IGBT only when the RC-IGBT is in reverse conduction mode. As explained above, the state of the RC-IGBT can be checked using the circuit of FIG. 6, for example. FIG. 15 shows collector to emitter voltages ($V_{CE, SAT}$) of the components and reference voltage ($V_{ref}$) used in FIG. 6. It is shown that $V_{CE,SAT1}$ is above the reference voltage indicating that switch $T_1$ is not in the reverse conducting mode, while $V_{CE,SAT2}$ is below the reference voltage at the time instant of the state change of the PT-signal $PT_2$ is generated. Thus, the enable signal $E_{PT1}$ for PT-signal $PT_1$ is low and for PT-signal $PT_2$ the enable signal $E_{PT2}$ changes its state at time instant $t_1$ outputting the pre-trigger signal as output signal $s_2$. As the enable signal for switch $T_1$ is low, the output signal from the enable block of FIG. 12 is the modulation signal with the dead-time $s_{d1}$.

When the pre-trigger pulse has been active, the component is controlled back to blocking state using off-pulses with a reduced gate resistance. These pulses are shown in FIG. 15 as signal $s_{1R}$, $s_{2R}$.

The PT-generator of FIG. 12 produces a PT-pulse with a suitable length at a correct time instant, and the PT-pulse is deactivated using reduced gate resistance at the same instant as the PT-pulse ends. Preferably, the length (from $t_0$ to $t_2$ in FIG. 2; from $t_1$ to $t_3$ in FIG. 15) of the PT-pulse is kept constant and therefore the length of the delay is controlled by changing the starting time instant of the PT-pulse. The start instant of the PT-pulse may be determined when the length or the duration of the PT-pulse ($t_1$-$t_3$), the desired delay ($t_2$-$t_3$) and the used dead-time ($t_0$-$t_2$) are known. The start of the PT-pulse should be such that the pulse ends after a known delay after the start of the control signal with the dead time. By marking the duration of the dead time as $t_{dead}$, the duration of delay as $t_{delay}$ and the duration of the PT-pulse as $t_{pulse}$, the start instant $t_1$ of the PT-pulse can be calculated as $$t_1 = t_{dead} + t_{delay} - t_{pulse}.$$

The start instant $t_1$ can be calculated at the time when the pulses with the dead time $s_{d1}$, $s_{d2}$ are received by the PT-generator 123, 124 in FIG. 12. Similarly, the time instant of the end of the PT-pulse can be calculated from the known time periods for controlling the PT-pulse from the component using gate resistor $R_{OFF2}$. The timing of signal $s_{2R}$ of FIG. 15 can be calculated by adding the known dead-time to the known delay time, and the addition gives the time instant for producing turn-off signal calculated from the instant ($t_0$) the PT-generator receives the high-to-low changing pulses with the dead time.

In the above example, the optimal delay for the PT-pulse was obtained using one current level. According to a preferred embodiment, the current level in which the delay time is determined is approximately half of the nominal current of the RC-IGBT. It has been found out experimentally that if a single delay is used for a switch component, a suitable delay is obtained when the delay is determined using a current that corresponds to a half of the nominal current of the component. The scheme for determining the delay presented above was presented as being carried out prior to use of the device in which the RC-IGBT is operational. However, the delay can be determined at any time suitable time. Further, the delay can be determined for multiple of current levels, and the delay that is taken into use can be selected based on the current level. The scheme for determining the delay can also be implemented during the use of the device such that the procedure presented in FIGS. 10 and 11 is carried out during actual operation. The delay may be stepwise altered around the optimum value achieved at the start-up routine and the reverse recovery current peak for a given collector current monitored. Once the delay that minimizes the reverse recovery current is found, it is used in the control of RC-IGBT. This tuning of the optimum delay may be done at a pre-set frequency during the operational life or it may be a continuous procedure.

The currents of the component can be estimated by the above described manner, or alternatively, the currents can be measured by using current sensors such as Rogowski coils, transformers, transducers, shunt resistors or other measurement devices or algorithms.

One possible implementation is described in detail above. It should be understood that the various parts associated with the implementation are separate entities as such allowing replacing the parts with other suitable structures or functions. Further, the entities do not require direct connection to the control of the RC-IGBT. For example, the determination of reverse recovery current can be used for other purposes.

Possible variations to the above described structure include the use of capacitive or inductive measurements of voltage $V_{bond,i}$ in connection with estimation of current. Further the analog to digital converters can be used for the measurement of the voltages, or a purely analog implementation for the comparison, detection and turn-off can be implemented. Also alternative implementations of the current estimation by using the integration of the bond voltage (analog or digital) can be used.

Variations for the functions implemented in the control stage (FPGA) include implementation of the functions by analog circuits. Further, instead of FPGA, other digital devices, such as MSP, DSP, microcontroller, etc. can be used.

The method and the arrangement of the invention are described above generally with reference to a series connection of controllable switch components. The actual device in which the method and the arrangement of the invention are used, is a converter having the series connection of components. Further, the converter having the series connection may be of any type of converter, such as an inverter or a frequency converter having multiple of series connections of the controlled switch components. In a known manner, the output of a converter can be formed of the common connection point of the series connected components.

It will be obvious to a person skilled in the art that, as the technology advances, the inventive concept can be implemented in various ways. The invention and its embodiments are not limited to the examples described above but may vary within the scope of the claims.

REFERENCES

[1] Drucke, D.; Silber, D., "Power diodes with active control of emitter efficiency," *Power Semiconductor Devices and ICs*, 2001. ISPSD '01. Proceedings of the 13th International Symposium on, vol., no., pp. 231, 234, 2001
[2] Daniel Domes, "Detection of the conduction state of an RC-IGBT." U.S. Pat. No. 8,729,914B2, issued May 20, 2014.
[3] ECKEL, H. G. and Bakran, M. M. "Method for controlling a reverse-conducting igbt." Patent WO 2010/149431A2, issued Dec. 12, 2010.
[4] Domes, D. and Bayerer, R. DE Patent DE102009001029 (B4), issued Dec. 9, 2010.
[5] Hermann, R.; Krafft, E. U., Marz, A, "Reverse-conducting-IGBTs—A new IGBT technology setting new benchmarks in traction converters," Power Electronics and Applications (EPE), 2013 15th European Conference on, vol., no., pp. 1, 8, 2-6 Sep. 2013 doi: 10.1109/EPE.2013.6631806
[6] Alvarez, V. R. and Fink, K. and Bernet, S. and Coccia, A. "Current balancing of parallel connected semiconductor components." Patent EP 2424112 A9, issued Jul. 4, 2012.
[7] Alvarez, R.; Bernet, S., "A new delay time compensation principle for parallel connected IGBTs," Energy Conversion Congress and Exposition (ECCE), 2011 IEEE, vol., no., pp. 3000, 3007, 17-22 Sep. 2011

The invention claimed is:

1. A method of controlling a reverse-conducting IGBT (RC-IGBT) component in a circuit comprising a series connection of controllable switch components where at least one of the controllable switch components is an RC-IGBT and the other component is to be controlled to a conductive state, the method comprising
applying a pre-trigger pulse to the gate electrode of the RC-IGBT during reverse conduction of the RC-IGBT at a first time instant ($t_1$), the pre-trigger pulse corresponding to a turn-on gate pulse,
applying a turn-on gate pulse at a second time instant ($t_2$) to the other controllable switch component of the series connection for controlling the other controllable switch component to a conductive state such that the pre-trigger pulse and the turn-on gate pulse overlap, and
ending the pre-trigger pulse after a delay time at the third time instant ($t_3$), the delay time being the time period when the turn-on gate pulse and the pre-trigger pulse overlap.

2. A method according to claim 1, wherein the delay time corresponds to a time period of overlapping turn-on gate pulse and the pre-trigger pulse that minimizes the reverse recovery current peak.

3. A method according to claim 2, wherein the method comprises
providing a control signal for the other controllable component,
applying a dead time to a rising edge of the control signal for producing the turn-on gate pulse, the length of the dead time being known,
calculating the first time instant ($t_1$) based on the time instant ($t_0$) of the rising edge of the control signal, the length of the dead time, the length of the pre-trigger pulse and length of the delay time, where the length of the pre-trigger pulse and the delay time are known.

4. A method according to claim 2, wherein the pre-trigger pulse has a fixed duration and the start instant ($t_1$) of the pre-trigger pulse is changed with respect to second time instant ($t_2$) to minimize the reverse recovery current peak.

5. A method according to claim 2, wherein the delay time is determined using the steps of
selecting an overlap period of zero,
a) applying a pre-trigger pulse to the RC-IGBT when it is a reverse conducting mode,
b) applying a turn-on control pulse to the gate of the other controllable switch component connected in series with the RC-IGBT such that the turn-on control pulse and the pre-trigger pulse overlap for the time of the selected overlap period,
c) measuring the duration of the current fall time ($t_{meas, i\text{-}ON}$) of the RC-IGBT,
d) increasing the overlap period of the pre-trigger pulse and the turn-on control pulse,
repeating the above steps a) to d) until the measured duration of the current fall time increases,
selecting the overlap period that produces minimum duration of the current fall time as the delay time.

6. A method according to claim 2, wherein the method comprises
determining the value of switched current of the RC-IGBT,
disabling the PT-pulses or setting the delay to zero when the value of switched current is below a set limit.

7. A method according to claim 1 or 2, wherein the method comprises
providing a control signal for the other controllable component,
applying a dead time to a rising edge of the control signal for producing the turn-on gate pulse, the length of the dead time being known,
calculating the first time instant ($t_1$) based on the time instant ($t_0$) of the rising edge of the control signal, the length of the dead time, the length of the pre-trigger pulse and length of the delay time, where the length of the pre-trigger pulse and the delay time are known.

8. A method according to claim 7, wherein the pre-trigger pulse has a fixed duration and the start instant ($t_1$) of the pre-trigger pulse is changed with respect to second time instant ($t_2$) to minimize the reverse recovery current peak.

9. A method according to claim 7, wherein the delay time is determined using the steps of
selecting an overlap period of zero,
a) applying a pre-trigger pulse to the RC-IGBT when it is a reverse conducting mode,
b) applying a turn-on control pulse to the gate of the other controllable switch component connected in series with the RC-IGBT such that the turn-on control pulse and the pre-trigger pulse overlap for the time of the selected overlap period,
c) measuring the duration of the current fall time ($t_{meas,i\text{-}ON}$) of the RC-IGBT, d) increasing the overlap period of the pre-trigger pulse and the turn-on control pulse, repeating the above steps a) to d) until the measured duration of the current fall time increases, selecting the overlap period that produces minimum duration of the current fall time as the delay time.

10. A method according to claim 7, wherein the method comprises determining the value of switched current of the RC-IGBT, disabling the PT-pulses or setting the delay to zero when the value of switched current is below a set limit.

11. A method according to claim 1, wherein the pre-trigger pulse has a fixed duration and the start instant ($t_1$) of the pre-trigger pulse is changed with respect to second time instant ($t_2$) to minimize the reverse recovery current peak.

12. A method according to claim 11, wherein the method comprises determining the value of switched current of the RC-IGBT, disabling the PT-pulses or setting the delay to zero when the value of switched current is below a set limit.

13. A method according to claim 1, wherein the delay time is determined using the steps of selecting an overlap period of zero, a) applying a pre-trigger pulse to the RC-IGBT when it is a reverse conducting mode, b) applying a turn-on control pulse to the gate of the other controllable switch component connected in series with the RC-IGBT such that the turn-on control pulse and the pre-trigger pulse overlap for the time of the selected overlap period, c) measuring the duration of the current fall time ($t_{meas,i\text{-}ON}$) of the RC-IGBT, d) increasing the overlap period of the pre-trigger pulse and the turn-on control pulse, repeating the above steps a) to d) until the measured duration of the current fall time increases, selecting the overlap period that produces minimum duration of the current fall time as the delay time.

14. A method according to claim 13, wherein the measuring the duration of the current fall time of the RC-IGBT comprises forming a voltage reference, comparing a voltage induced to the inductance of the RC-IGBT during reverse conduction of the RC-IGBT, and measuring the time the induced voltage exceeds the voltage reference.

15. A method according to claim 1, wherein the method comprises determining the value of switched current of the RC-IGBT, disabling the PT-pulses or setting the delay to zero when the value of switched current is below a set limit.

16. A method according to claim 1, wherein the PT-pulse is turned-off with a reduced gate off resistance ($R_{OFF2}$).

17. An arrangement of controlling a reverse-conducting IGBT (RC-IGBT) component in a circuit comprising a series connection of controllable switch components where at least one of the switch components is an RC-IGBT and the other component is to be controlled to a conductive state, the arrangement comprising means for applying a pre-trigger pulse to the gate electrode of the RC-IGBT during reverse conduction of the RC-IGBT at a first time instant ($t_1$), the pre-trigger pulse corresponding to a turn-on gate pulse, means for applying a turn-on gate pulse at a second time instant ($t_2$) to the other controllable switch component of the series connection for controlling the other controllable switch component to a conductive state such that the pre-trigger pulse and the turn-on gate pulse overlap, and means for ending the pre-trigger pulse after a delay time at the third time instant ($t_3$), the delay time being the time period when the turn-on gate pulse and the pre-trigger pulse overlap.

18. An arrangement according to claim 17, wherein the means for applying a pre-trigger pulse comprises a logic circuit adapted to produce the pre-trigger pulse based on the control signal for the other controllable switch, known length of a dead time which is applicable to a rising edge of the control signal, the logic circuit being adapted to calculate the first time instant ($t_1$) based on the time instant ($t_0$) of the rising edge of the control signal, the length of the dead time, the length of the pre-trigger pulse and length of the delay time, where the length of the pre-trigger pulse and the delay time are known.

19. An arrangement according to claim 18, wherein the series connection of controllable switch components is incorporated in a converter, the common point between the components of the series components forming a phase output of the converter.

20. An arrangement according to claim 17, wherein the series connection of controllable switch components is incorporated in a converter, the common point between the components of the series components forming a phase output of the converter.

* * * * *